United States Patent [19]
Baird et al.

[11] Patent Number: 5,260,963
[45] Date of Patent: Nov. 9, 1993

[54] METHOD AND APPARATUS FOR EFFICIENT OPERATIONOF A SOLID-STATE LASER OPTICALLY PUMPED BY AN UNSTABLE RESONATOR SEMICONDUCTOR LASER

[75] Inventors: Brian Baird, Lake Oswego; Richard DeFreez, Hillsboro, both of Oreg.

[73] Assignee: Electro Scientific Industries, Inc., Portland, Oreg.

[21] Appl. No.: 873,411

[22] Filed: Apr. 24, 1992

[51] Int. Cl.$^5$ .............................. H01S 3/08
[52] U.S. Cl. ....................... 372/95; 372/99; 372/69; 372/41; 372/92
[58] Field of Search ............ 372/72, 39, 41, 69, 372/92, 99, 101, 95

[56] References Cited

U.S. PATENT DOCUMENTS

| | | | |
|---|---|---|---|
| 3,982,201 | 9/1976 | Rosenkrantz et al. | 331/94.5 P |
| 4,688,884 | 8/1987 | Scifres et al. | 350/96.15 |
| 4,710,940 | 12/1987 | Sipes, Jr. | 372/75 |
| 4,761,786 | 8/1988 | Baier | 372/10 |
| 4,763,975 | 8/1988 | Scifres et al. | 350/96.15 |
| 4,811,349 | 3/1989 | Payne et al. | 372/41 |
| 5,022,043 | 6/1991 | Jacobs | 372/95 |
| 5,105,434 | 4/1992 | Krupke et al. | 372/41 |
| 5,131,002 | 7/1992 | Mooradian | 372/69 |

OTHER PUBLICATIONS

"High Power, Nearly Diffraction-Limited Output from a Semiconductor Laser with an Unstable REsonator," *IEEE Journal of Quantum Electronics*, 2098-2108, vol. 27, No. 9, (Sep. 1991) by Tilton, . . . DeFreez et al.
"Cr: LiCaAlF$_6$ Laser Pumped by Visible Laser Diodes," *IEEE Journal of Quantum Electronics*, 1968-1970, vol. 27, No. 8, (Aug. 1991) by Scheps.
"Diode-Pumped Cr: LiSrAlF$_6$ Laser," *Optics, Letters*, 820-822, vol. 16, No. 11 (Aug. 1991) by Scheps et al.
"Laser Performance of LiSrAlF$_6$:Cr$^{3+}$," *Journal of Applied Physics*, 1051-1055, vol. 66, No. 3 (Aug. 1, 1989) by Payne et al.
"LiCaAlF$_6$:Cr$^{3+}$: A Promising New Solid-State Llaser Material," *IEEE Journal of Quantum Electronics*, 2243-2252, vol. 24, No. 11, (Nov. 1988) by Payne et al.
"Optimum Mode Size Criteria for Low Gain Lasers," *Applied Optics*, 1579-83, vol. 20 (May 1, 1981), by Hall.
"Efficient LiNdP$_4$O$_{12}$ Lasers Pumped with a Laser Diode," *Applied Optics*, vol. 18, No. 23 (Dec. 1, 1979) by Kubodera and Otsuka.
"Observations of Self-Focusing in Stripe Geometry Semiconductor Lasers and Development of a Comprehensive Model of Their Operation," *IEEE Journal of Quantum Electronics*, 705-719, vol. QE-13 (Aug. 8, 1977) by Kirkby et al.

*Primary Examiner*—Léon Scott, Jr.
*Attorney, Agent, or Firm*—Stoel Rives Boley Jones & Grey

[57] ABSTRACT

High-power optical output (60) that exhibits a high degree of lateral and transverse spatial coherence from an unstable resonator semiconductor laser (14) is efficiently optically coupled into a lasant mode volume (76) of a solid-state laser (28). This apparatus and method of pumping enable the preferred lasants, Cr:LiCAF and Cr:LiSAF, to reach laser operation at a reduced pumping level.

26 Claims, 2 Drawing Sheets

METHOD AND APPARATUS FOR EFFICIENT OPERATION OF A SOLID-STATE LASER OPTICALLY PUMPED BY AN UNSTABLE RESONATOR SEMICONDUCTOR LASER

TECHNICAL FIELD

The present invention relates to solid-state lasers optically pumped by semiconductor lasers and, in particular, to a method and an apparatus for generating useful laser output from a solid-state laser optically pumped by an unstable resonator semiconductor laser.

BACKGROUND OF THE INVENTION

A variety of methods have been employed for optically pumping solid-state lasers, such as neodymium-doped lithium yttrium fluoride (Nd:YLF) or neodymium-doped yttrium aluminum garnet (Nd:YAG). A common method is to use an arc lamp or other similar light source to excite a laser rod. The light source and laser rod are positioned within and at different foci of a highly reflective housing of elliptical cross-section. This method typically requires relatively large diameter laser rods to efficiently absorb enough of the pumping light emitted by the light source to allow solid-state laser operation. Another limitation of this pumping method is the relative inefficiency caused by poor overlap of the optical emission spectrum of the pumping light source with the absorption bandwidth of the solid-state lasants.

This method typically entails the use of arc-pumped, solid-state lasers, which commonly require water cooling systems that place a severe cumbrance on clean room environments typically preferred for link processing of dynamic random access memory devices performed by, for example, arc-pumped, Q-switched, Nd:YAG lasers.

There are several different methods for diode-pumping solid-state lasers. In U.S. Pat. No. 3,982,201, Rosenkrantz et al. describe a solid-state laser that is pumped by single diode lasers or arrays of diode lasers to which the solid-state laser rod is directly end-coupled. Because the output wavelength of the diode laser array is a function of its temperature, the diode lasers are operated in a pulsed mode at a low duty cycle to maintain the array at a sufficiently stable temperature so that its output wavelength remains matched to the absorption bandwidth of the solid-state laser rod. The output power characteristics of this laser system are limited by the relatively inefficient match between the output of the diode lasers and the mode volume of the solid-state laser rod.

In "Efficient LiNdP$_4$O$_{12}$ Lasers Pumped with a Laser Diode," *Applied Optics*, vol. 18, No. 23 (Dec. 1, 1979), Kubodera and Otsuka describe the well-known practice of collecting the output light of a diode laser and focusing its expanded output light using conventional lenses, such as two microscope condenser lenses. This method is particularly well suited for applications where emitter width and divergence of the diode laser are small. However, as the emitter dimensions and beam divergence increase, it becomes increasingly difficult to efficiently collect the output beam with collection lens or lenses. It also becomes more difficult to focus the expanded beam into the solid-state lasant crystal with sufficient depth of focus to allow efficient overlap of the pump beam throughout the resonator mode volume within the lasant.

In U.S. Pat. No. 4,710,940, Sipes, Jr. describes a Nd:YAG solid-state laser that is end-pumped by a diode laser array or by two diode laser arrays that have been combined by use of polarizing beam-splitting cubes. Sipes, Jr., cites the analysis of D.G. Hall in "Optimum Mode Size Criteria for Low Gain Lasers," *Applied Optics*, 1579–1583, vol. 20, (May 1, 1981), to suggest that the "pump profile shape does not matter much as long as all the pump light falls within the resonator mode." Sipes, Jr., notes, however, that Hall's analysis does not account for the divergence properties of Gaussian beams, so Sipes, Jr., suggests that, if required, the cross-section of the pump beam could be modified by use of a cylindrical lens.

In U.S. Pat. No. 4,761,786, Baer describes a Q-switched, solid-state laser that is end-pumped by a diode laser or diode laser array. The output light from the pump source is collected by a collimating lens and directed by a focusing lens to end-pump the laser rod. Baer notes that "other lenses to correct astigmatism may be placed between the collimating lens and focusing lens." Baer also describes an alternate embodiment that employs a remotely positioned diode laser pumping source coupled through an optical fiber, the output of which is focused by a lens into the laser rod.

In U.S. Pat. No. 4,763,975, Scifres et al. describe two optical systems that produce bright light output for a variety of applications, including pumping a solid-state laser such as a Nd:YAG. Scifres et al. describe an optical system that employs a plurality of diode lasers, each of which is coupled into one of a plurality of fiber-optic waveguides. The waveguides are arranged to form a bundle and the light from the diode laser sources is emitted at the output end of the bundle. Optics, such as a lens, may be used to focus the light into a solid-state laser medium. Alternatively, the fiber bundle may be "butt"-coupled to the laser rod. (Butt coupled means end-coupled at a position very close to or in contact with the laser rod.)

Scifres et al. describe another optical system that employs a diode laser bar, broad-area laser, or other elongated source to pump a solid-state laser. The diode laser bar light output is coupled into a fiber-optic waveguide having an input end that has been squashed to be elongated and thereby have core dimensions and lateral and transverse numerical apertures that correspond respectively to those of emission dimension and lateral and transverse divergence angles of the diode laser bar. The output light from the fiber-optic waveguide is either focused by a lens into the end of the solid-state laser rod or butt-coupled to the rod. Scifres et al. state that either end of the fiber-optic waveguide can be curved. Although these methods attempt to match the output light from the fiber-optic waveguide to the resonant cavity mode of the solid-state laser, they are limited in efficiency by the numerical aperture of the sources that can be effectively collected and guided by the fiber-optic waveguides.

Certain methods are known for efficiently coupling the output of high-power diode lasers into solid-state lasants. High-power diode lasers are necessarily broad-area devices or arrays of narrow-width diode lasers because the potential for catastrophic optical damage to the mirrors dictates the optical outputs be limited typically to 10 to 20 mW per micron of emission stripe width. Typical high-power diode lasers used to pump solid-state lasants include aluminum gallium arsenide (AlGaAs) diode lasers. Examples of such laser diodes include Model No. SDL-2480-P1 with continuous wave (CW) output power of 3.0 watts (W) and an emission width of 500 μm; Model No. SDL-2462-P1 with CW output power of 1.0 W 35 and an emission width of 200 μm; and Model No. SDL-2432-P1 with CW output power of 0.5 W and an emission width of 100 μm, all of which are manufactured by Spectra Diode Labs, 80 Rose Orchard Way, San Jose, California. Use of AlGaAs semiconductor diode lasers to optically pump solid-state lasers has led to development of compact, solid-state lasers.

Broad-area lasers are described by G.H.B. Thompson in "A Theory for Filamentation in Semiconductor Lasers", *Optoelectronics*, 257-310, vol. 4, (1972) and by P.A. Kirkby, et al. in "Observations of Self-Focusing in Stripe Geometry Semiconductor Lasers and Development of a Comprehensive Model of Their Operation," *IEEE Journal of Quantum Electronics*, 705-719, vol. QE-13 (1977). Such broad-area lasers (emission width of typically greater than 5 μm) typically exhibit a filamentary structure in their optical near-field patterns. The filament structures arise from a nonlinear interaction between the carriers and the optical field in the active area of the laser. The process of stimulated emission effectively reduces the gain profile within the active area and results in an increase in the refractive index in the portion of the active area contributing most strongly to the optical mode. This region of increased refractive index is bounded by regions of the active area which do not contribute so strongly to the optical mode and are characterized by smaller refractive index values. This lateral variation in refractive index in a local region within the active area of the diode laser can form a local lateral index guide.

When the active area is broader than about 5-10 μm, as is the case in typical high-power diodes used for solid-state laser pumping, several, or in some cases, many such index-guided regions may form. Stimulated emission within each such lateral index-guided region within the active area may occur in the form of a filament that is only partly spatially coherent or is spatially incoherent with respect to neighboring filaments. This filamentation phenomena is, therefore, a fundamental source of lateral spatial incoherence in high-power laser diodes and, consequently, places limits on the optical brightness obtainable from such devices.

Concurrently filed U.S. patent application of Baird, DeFreez, and Sun for Method and Apparatus for Generating and Employing a High Density of Excited Ions in a Lasant, which is assigned to assignee of the present application, describes a method for employing a high-power diode laser to longitudinally optically pump the mode volume of a solid-state lasant. The high-power diode laser in the preferred embodiment described by Baird et al. is of a type that is typically gain-guided in the lateral plane of the device and index-guided in the transverse plane. Accordingly, the laser diode is typically spatially incoherent in the lateral plane, thus limiting its optical brightness. Baird et al. also describe a method of employing a nonimaging concentrator to efficiently collect optical output from such a high-power diode laser and couple it into the mode volume of a solid-state lasant.

Although these methods have with varying degrees of efficiency been used to optically pump solid-state laser mode volumes and been used to produce useful solid-state laser output at a variety of emission wavelengths, improved methods for coupling the optical output from diode lasers into solid-state lasants are highly desirable. Such methods would be very useful in diode pumping of the new chromium-doped solid-state laser materials such as chromium:lithium calcium aluminum fluoride (Cr:LiCAlF) and chromium:lithium strontium aluminum fluoride (Cr:LiSAlF). These solid-state laser materials are described by S.A. Payne, et al., in "LiCaAlF$_6$:Cr$^{3+}$: A Promising New Solid-State Laser Material," *IEEE Journal of Quantum Electronics*, 2243-2252, vol. 24, No. 11, (November 1988); S.A. Payne, et al., in "Laser Performance of LiSrAlF$_6$:Cr$^{3+}$," in *Journal of Applied Physics*, 1051-1055, vol. 66, No. 3; and by S.A. Payne et al. in U.S. Pat. No. 4,811,349.

These inhomogenously broadened materials can be optically pumped by aluminum gallium indium phosphide (AlGaInP) laser diodes as described by Scheps, et al., in "Cr:LiCaAlF$_6$ Laser Pumped by Visible Laser Diodes," *IEEE Journal of Quantum Electronics*, 1968-1970, vol. 27, No. 8, (August 1991) and by Scheps, et al., in "Diode-Pumped Cr:LiSrAlF$_6$ Laser," *Optics Letters*, 820-822, vol. 16, No. 11, (Jun. 1, 1991). However, the relatively low stimulated emission cross-section-fluorescence lifetime product of these materials implies a requirement for relatively large pump powers to obtain laser operation at threshold by pumping with such broad area, high-power diode lasers. This requirement results from the relatively large pumping beam radius inherent from the lateral spatial incoherence typical of such devices. The optical output of such a broad-area, high-power diode laser coupled via conventional methods into such an inhomogenously broadened material is, therefore, a relatively inefficient process.

A method for theoretically obtaining high-power, nearly diffraction-limited optical output from a high-power laser diode has recently been described by Tilton, ... DeFreez, et al., in "High Power, Nearly Diffraction-Limited Output from a Semiconductor Laser with an Unstable Resonator," *IEEE Journal of Quantum Electronics*, 2098-2108, vol. 27, No. 9, (September 1991). The high-power AlGaAs laser diode described therein demonstrates high power (greater than 1 watt from both facets) and nearly diffraction-limited optical output. The reference states that "[f]or many semiconductor laser applications, such as solid-state laser end pumping ..., single-lobed, diffraction-limited beams of hundreds of milliwatts are required." However, methods for coupling the bright optical output from an unstable resonator semiconductor laser (URSL) into a solid-state lasant have not heretofor been attempted. Furthermore, improvements in development of high-power URSL devices for use as very bright optical pumping sources for solid-state lasers are, therefore, also highly desirable.

Thus, improved methods for coupling the optical output of high-power diode lasers, especially those having improved lateral spatial coherence, into the mode volumes of a laser medium is highly desirable. Such methods for pumping Cr:LiCAlF and Cr:LiSAF to ultimately produce usable frequency doubled optical output in the 360-460 nm wavelength range are described in detail in concurrently filed U.S. patent application of Baird and DeFreez for High-Power, Compact, Diode-Pumped, Tunable Laser, which is assigned to assignee of the present application.

SUMMARY OF THE INVENTION

The present invention is a method and an apparatus for efficient operation of a solid-state laser optically pumped by an unstable resonator semiconductor laser (URSL). The high-power optical output, which exhibits a high degree of lateral and transverse spatial coherence, from the URSL is readily focused to form a pumping beam to longitudinally end-pump a laser resonator cavity containing a laser medium. The pumping beam radius is chosen to be well-matched to the resonator mode radius within the laser medium. The pumping beam is also focused to have a depth of focus within the laser medium to allow excellent absorption of the pumping beam by that part of the laser medium contained within the resonator mode volume.

An object of the present invention is, therefore, to provide a longitudinally URSL-pumped, solid-state laser.

Another object of this invention is to provide an optical system incorporating a URSL and lens system that cooperate to generate a very bright optical output useful for optically pumping laser resonators.

A further object of this invention is to produce a longitudinally URSL-pumped solid-state laser in which the laser rod is Cr:LiCAF or Cr:LiSAF and in which the solid-state laser reaches laser operation at relatively low pumping power output.

FIG. 1 is a graphical representation of exemplary analytical data depicting output power vs. diode-pumping power applied to a Cr:LiCAF laser. The data illustrate the operation of a Cr:LiCAF laser achieved with pumping power supplied by a broad-area diode laser (slope A) and by an URSL (slope B), each having equal emission widths and cavity lengths. Slope A demonstrates that an URSL of the present invention provides not only a reduction in threshold, but also provides a substantially better slope efficiency. A person skilled in the art will appreciate that these differences are generally true regardless of changes made to the numerous variables used to calculate the data illustrated in FIG. 1.

Additional objects and advantages of the present invention will be apparent from the following detailed description of preferred embodiments thereof, which proceeds with reference to the accompanying drawings.

DETAILED DESCRIPTION OF PREFERRED EMBODIMENTS

Figure 1:
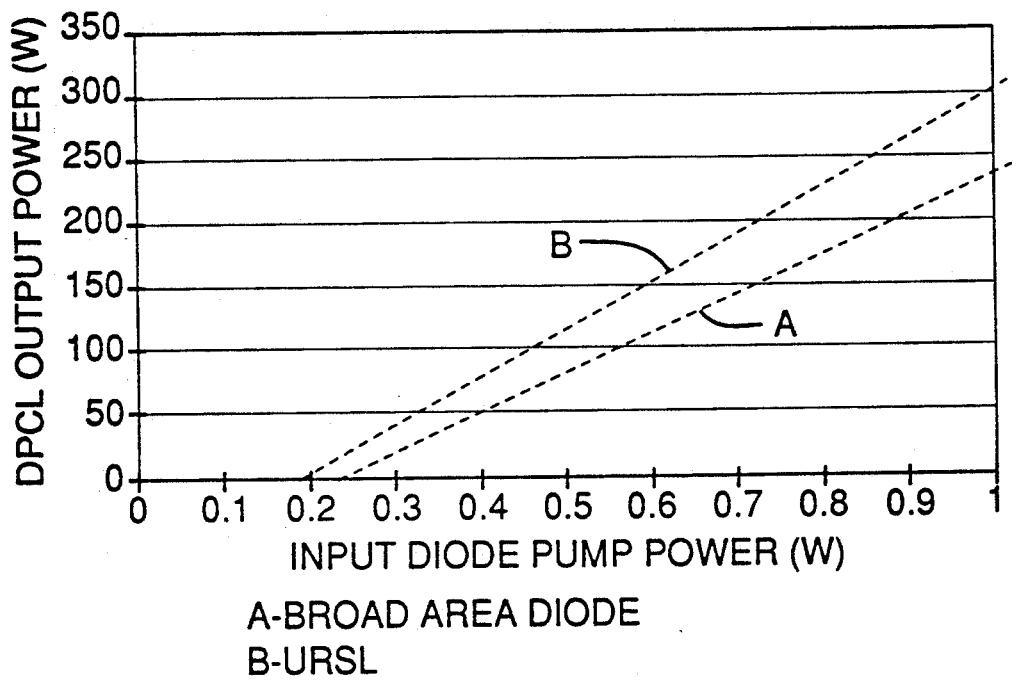
FIG. 1 is a graphical representation of analytical data illustrating the differences in diode output power for operation of a Cr:LiCAF laser when pumped respectively, a broad-area diode laser and an URSL, each having equal emission widths and cavity lengths.
Figure 2:
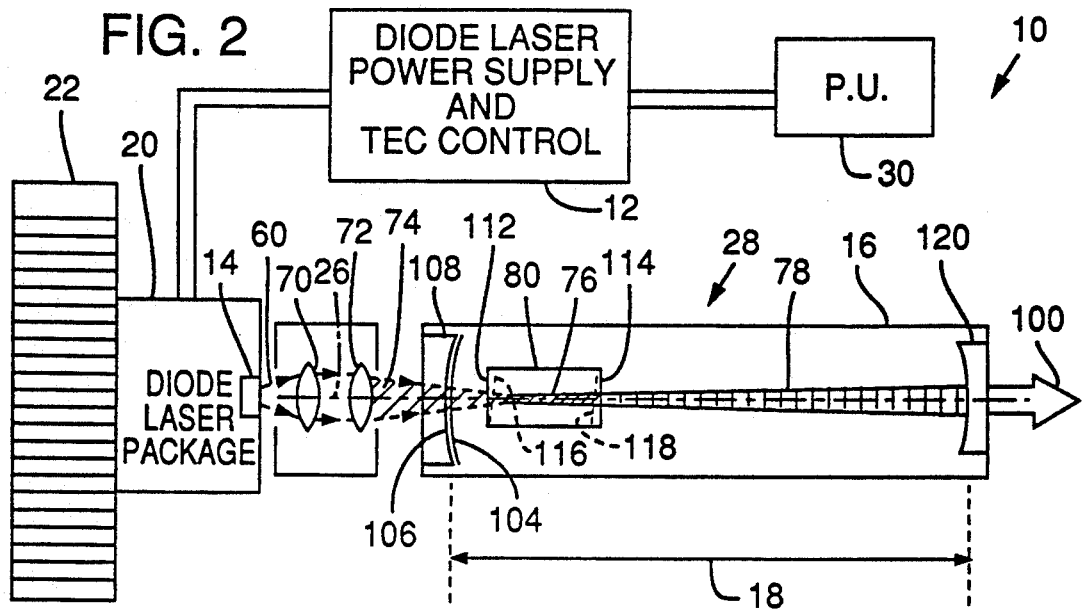
FIG. 2 is a partly schematic plan view of a preferred embodiment of a laser system incorporating an unstable resonator semiconductor laser (URSL), a lens system, and a solid-state lasant in accordance with the present invention.
Figure 3:
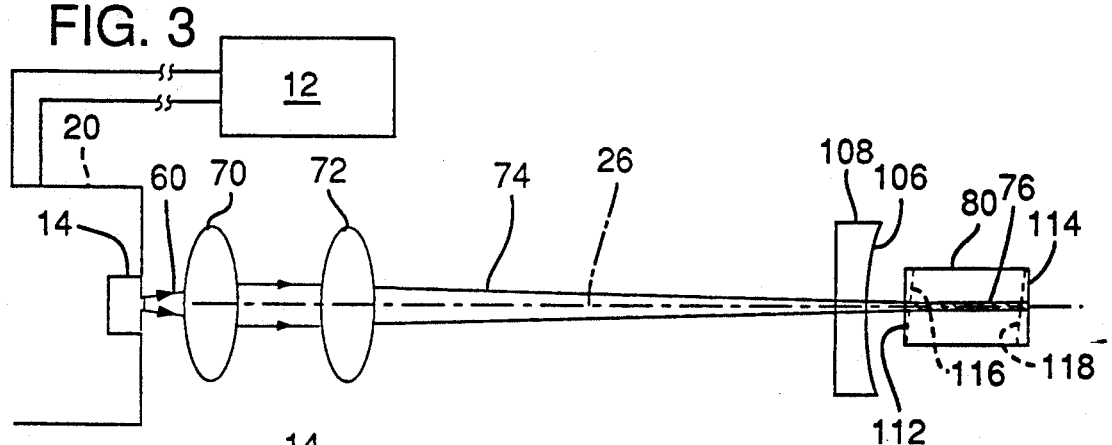
FIG. 3 is an enlarged side view of a lens system that is used to couple output light emitted by the URSL into the solid-state laser resonator cavity of the laser system of FIG. 2.
Figure 4A:
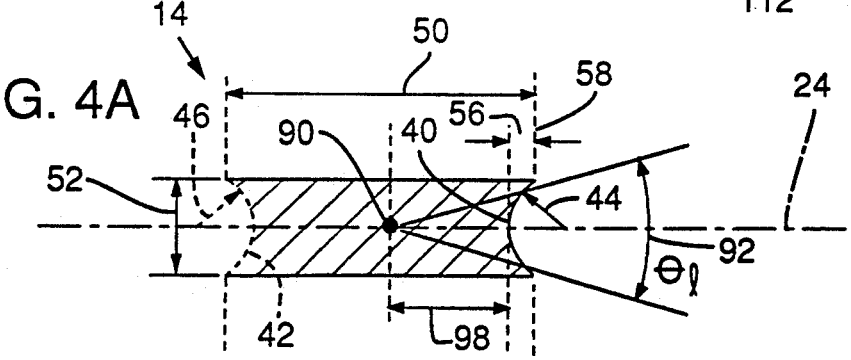
FIGS. 4A and 4B are respective enlarged plan and side elevation illustrations of an URSL incorporated in the laser system of FIG. 2.
Figure 4B:
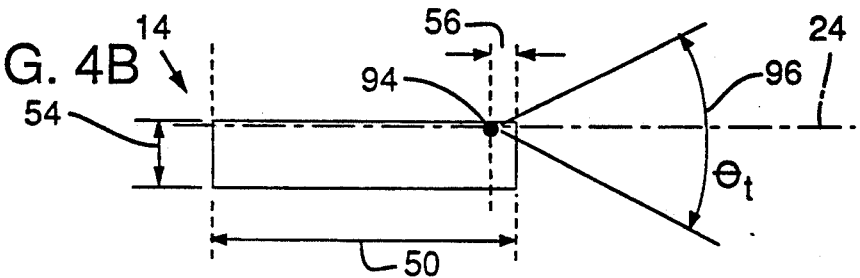

With reference to FIGS. 2 and 3, laser system 10 includes a power supply 12 for supplying electrical current to a high-power URSL 14 with an optical output power of greater than 250 mW to pump a solid-state laser resonator cavity 16 having a cavity length 18 of about 15 mm. High-power URSL 14 forms part of a laser diode package 20 that is connected to a heat sink 22. High-power URSL 14 is positioned so that its optic axis 24 (FIGS. 4A and 4B) may be substantially coaxial to an optic axis 26 that extends through resonator cavity 16 of a solid-state laser 28. A processing unit (PU) 30 determines the power level and other signal levels supplied by power supply 12 to high-power URSL 14.

High-power URSL 14 can be fabricated by focused ion beam micromachining its end surfaces to have predetermined radii of curvature, as described in Tilton, . . . . DeFreez, et al. With reference to a preferred embodiment shown in FIGS. 4A and 4B, a broad-area, high-power AlGaInP semiconductor diode laser, which typically emits at wavelengths in the range 610 nm to 690 nm has one or both mirrors 40 and 42 micromachined to have respective radii of curvature 44 and 46 such that the combination of mirror curvatures 44 and 46 yield imparts a greater than unity lateral magnification to an optical field propagating within high-power URSL 14. For example, a high-power URSL 14 may have a cavity length 50 of 500 $\mu$m, an active area width 52 of 200 $\mu$m, an active area thickness 54 of 0.005–2.0 $\mu$m, and a mirror 42 with spherical radius of curvature 46 of infinity. Such a high-power URSL 14 could have a mirror 40 micromachined to have a spherical radius of curvature 44 of 2200 $\mu$m with maximum sag depth 56 of 2.3 $\mu$m along URSL optical axis 24 of high-power URSL 14 with respect to its unmachined facet plane 58. Such a high-power URSL 14 would have a resonator magnification of about 2.5.

Unlike conventional high-power diode lasers and arrays of diode lasers used for pumping solid-state lasants, high-power URSL 14 exhibits lateral spatial coherence as well as transverse spatial coherence. This improvement in spatial coherence results in high-power URSL 14 generating a high-power optical output 60 (typically greater than about 0.1 W and preferably greater than 0.25 W) that can be efficiently collected by a lens system 70, which typically includes a collection lens and a cylindrical lens. Optical output 60 is subsequently focused by an objective lens 72 to form an optical pumping beam 74 that has its radius and depth of focus selected to be well-matched to the radius and length of a lasant mode volume 76. The lasant mode volume 76 constitutes the portion of mode or beam volume 78 of resonator cavity 12 that is contained within lasant 80.

Analyses suggest that adjustments to the radii of curvature 44 and 46 of the respective mirrors 40 and 42, in combination with adjustments to the cavity length 50, can modify divergence angle 92 originating from virtual point source 90 in the lateral plane to make angle 92 substantially equal to divergence angle 96 originating from real point source 94 in the transverse plane of high-power URSL 14.

Employing high-power URSL 14 to generate optical pumping beam 74 allows efficient pumping of a generally cylindrical lasant mode volume 76 having a small radius (less than 50 $\mu$m). This arrangement effectively reduces the power of optical output 60 required from high-power URSL 14 to obtain threshold operation of solid-state laser 28. Furthermore, optical pumping beam 74 is preferably selected with lasant mode volume 76 to produce TEM$_{00}$ mode laser operation, a useful property which allows optical output 100 from resonator cavity 16 of laser system 10 to be readily focused by conventional optical methods.

Lasant 80 is preferably a chromium-doped crystal, such as Cr:LiSrAlF$_6$ (Cr:LiSAlF) or Cr:LiCaAlF$_6$ (Cr:LiCAlF), positioned along optic axis 26. The preferred dopant level for Cr:LiSAlF or Cr:LiCAlF lasants 80 employed in the present invention is greater than 1.0% atomic. Skilled persons will appreciate that lasant 80 may be any chromium-doped fluoride composition of Cr$^{3+}$:XYZF$_6$ wherein X is Li$^+$, Na$^+$, K$^+$, and Rb$^+$, Y is selected from Ca$^{2+}$, Sr$^{2+}$, Ba$^{2+}$, Cd$^{2+}$, and Mg$^{2+}$, Z is selected from Al$^{3+}$, Ga$^{3+}$, and Sc$^{3+}$. Furthermore, lasant 80 may alternatively be doped with a rare earth ion selected from neodymium, holmium, erbium, and thulium.

A dichroic coating 104 is applied to a preferably curved surface 106 of a rear resonator mirror 108. Dichroic coating 104 is highly transmissive at the preselected high-power URSL pump wavelength such as 650 nm and highly reflective at a preselected solid-state lasant emission wavelength such as 780 nm. Lasant surfaces 112 and 114 may be coated for high transmission at the lasant emission wavelength, and may have respective wedge angles 116 and 118, which may be the Brewster's angle defined by the emission wavelength and polarization. An output coupling mirror 120, which is partly transmissive at the lasant emission wavelength and which may have a radius of curvature, forms the opposite end of resonator cavity 16.

In the preferred embodiment, resonator mirror 108 has a radius of curvature of 100 mm and output coupling mirror 120 has a radius of curvature 20 mm. The radii of curvature are chosen in conjunction with cavity length 18 and the geometry of lasant 80 to provide a resonator mode beam waist or radius waist that permits low threshold laser operation. Lasant 80 has a length of about 5 mm and has a rectangular cross section of 4 mm ×5 mm. A TEM$_{00}$ mode radius waist of less than 40 μm is located within lasant mode volume 76 near lasant surface 112. Optical pumping beam 74 is focused to have a beam radius well-matched to the TEM$_{00}$ mode radius throughout lasant mode volume 76. Skilled persons will appreciate that in FIG. 2, mode or beam volume 78 is shown greatly enlarged for ease of visualization and does not represent a true path through the other elements in FIG. 2.

In an alternate embodiment, resonator mirror 108 is eliminated and dichroic coating 104 is applied to lasant surface 112 so that it forms one reflective surface of resonator cavity 16. When used as one of the reflective surfaces of resonator cavity 16, lasant surface 112 may be fabricated with an appropriate radius of curvature.

In another embodiment, high power URSL 14 is composed of the conventional light-emitting semiconductor material AlGaAs. In this embodiment, lasant 80 may be a neodymium-doped laser crystal, such as Nd:YAG or Nd:YLF, or a stoichiometric neodymium material such as LNP, all of which have spectral absorption bandwidths that can be matched to the emission spectrum of a high-power AlGaAs URSL by wavelength selection of the URSL. Temperature tuning the emission wavelength of the laser diode may also be employed as needed. Temperature tuning is well-known to the art and is described, for example, in "Laser Diode Guide Book," Sony Corporation of America, p. 52.

It will be obvious to those having skill in the art that various changes may be made in the details of the above-described embodiments of the present invention without departing from the underlying principles thereof. For example, high power URSL 14 can be composed of other light-emitting semiconductor materials such as InGaAsP or ZnSe. Furthermore, solid-state lasant 80 may comprise other lasant crystals such as those doped with a rare earth ion such as holmium or erbium. The scope of the present invention should, therefore, be determined only by the following claims.

We claim:

1. A method for generating bright output light from a solid-state laser including a solid-state lasant having an absorption bandwidth and a mode volume, comprising:
   employing an unstable resonator semiconductor laser to generate optical pumping light having an emission wavelength that is well-matched to the absorption bandwidth of the solid-state laser; and
   efficiently coupling the optical pumping light from the unstable resonator semiconductor laser into the mode volume of the solid-state laser to generate bright output light.

2. The method of claim 1 in which the unstable resonator semiconductor laser comprises a material selected from AlGaAs, AlGaInP, InGaAsP, and ZnSe.

3. The method of claim 1 in which the solid-state lasant is fabricated from a chromium-doped fluoride crystal of Cr$^{3+}$:XYZF$_6$ composition wherein X is selected from Li$^+$, Na$^+$, K$^+$, and Rb$^+$, Y is selected from Ca$^{2+}$, Sr$^{2+}$, Ba$^{2+}$, Cd$^{2+}$, and Mg$^{2+}$, and Z is selected from Al$^{3+}$, Ga$^{3+}$, and Sc$^{3+}$.

4. The method of claim 1 in which the solid-state lasant is doped with a rare earth ion selected from neodymium, holmium, erbium, and thulium.

5. The method of claim 1 in which the bright output light comprises primarily red light.

6. The method of claim 1 in which the unstable resonator semiconductor laser includes:
   a resonator having a length, a virtual point source in a lateral plane, and a real point source in a transverse plane; and
   a mirror having a radius of curvature that forms one end of the resonator, the resonator length and mirror radius of curvature selected so that an optical field propagating within the high-power semiconductor laser experiences greater than unity lateral magnification and so that the optical field has a lateral divergence angle originating from the virtual point source and a transverse divergence angle originating from the real point source that are substantially equal, thereby to provide the optical output with a high degree of lateral and transverse spatial coherence.

7. A method for substantially improving optical brightness of output light generated by a high-power unstable semiconductor laser resonator, comprising:
   selecting a length for the resonator, the resonator having a mirror with a radius of curvature and generating an output light from a virtual point source in a lateral plane and a real point source in a transverse plane; and
   selecting the radius of curvature of the mirror in conjunction with the resonator length so that the output light has a lateral divergence angle originating from the virtual point source and a transverse divergence angle originating from the real point source that are substantially equal, thereby generating bright output light having a high degree lateral and transverse spatial coherence.

8. The method of claim 7 in which the unstable resonator semiconductor laser generates an optical pumping light of a power of greater than about 0.1 W.

9. The method of claim 7 in which the unstable resonator semiconductor laser comprises a material selected from AlGaAs, AlGaInP, InGaAsP, and ZnSe.

10. The method of claim 7 which the solid-state lasant is doped with a rare earth ion selected from neodymium, holmium, erbium, or thulium.

11. The method of claim 7 in which the solid-state lasant is fabricated from a chromium-doped fluoride crystal of $Cr^{3+}:XYZF_6$ composition wherein X is selected from $Li^+$, $No^+$, $K^+$, and $Rb^+$, Y is selected from $Ca^{2+}$, $Sr^{2+}$, $Ba^{2+}$, $Cd^{2+}$, and $Mg^{2+}$, and Z is selected from $Al^{3+}$, $Ga^{3+}$, and $Sc^{3+}$.

12. The method of claim 7 in which the bright output light comprises primarily red light.

13. A high-power unstable resonator semiconductor laser for generating optical output, comprising:
a resonator having a length, a virtual point source in a lateral plane, and a real point source in a transverse plane; and
a mirror having a radius of curvature that forms one end of the resonator, the resonator length and mirror radius of curvature selected so that optical field propagating within the high-power semiconductor laser experiences greater than unity lateral magnification and so that the optical field has a lateral divergence angle originating from the virtual point source and a transverse divergence angle originating from the real point source that are substantially equal, thereby to provide optical output having a high degree of lateral and transverse spatial coherence.

14. The unstable resonator semiconductor laser of claim 13 that generates an optical output of a power of greater than about 0.1 W.

15. The unstable resonator semiconductor laser of claim 13 further comprising a material selected from AlGaAs, AlGaInP, InGaAsP, and ZnSe.

16. The unstable resonator semiconductor laser of claim 13 which the optical output primarily comprises red light.

17. The unstable resonator semiconductor laser method of claim 13 in which the solid-state lasant is fabricated from a chromium-doped fluoride crystal of $Cr^{3+}:XYZF_6$ composition wherein X is selected from $Li^+$, $Na^+$, $K^+$, and $Rb^+$, Y is selected from $Ca^{2+}$, $Sr^{2+}$, $Ba^{2+}$, $Cd^{2+}$, and $Mg^{2+}$, and Z is selected from $Al^{3+}$, $Ga^{3+}$, and $Sc^{3+}$.

18. An unstable resonator semiconductor laser-pumped, solid-state laser, comprising:
a solid-state resonator cavity having a first optic axis and having a rear mirror and an output mirror positioned about the first optic axis such that the mirrors form ends of the optical resonator cavity;
a solid-state lasant positioned about the first optic axis and between the rear mirror and the output mirror, the solid-state lasant having an absorption bandwidth and a mode volume;
an unstable resonator semiconductor laser having a second optic axis and positioned so that the second optical axis is substantially coaxial with the first optic axis, the unstable resonator semiconductor laser also having an emission wavelength that is well-matched to the absorption bandwidth of the solid-state lasant; and
a coupling system to efficiently collect optical output from the unstable resonator semiconductor laser and subsequently guide the optical output into the solid-state lasant mode volume.

19. The unstable resonator semiconductor laser-pumped, solid-state laser of claim 18 in which the unstable resonator semiconductor laser is of a high-power type.

20. The unstable resonator semiconductor laser-pumped, solid-state laser of claim 18 in which the solid-state lasant is fabricated from a chromium-doped fluoride crystal of $Cr^{3+}:XYZF_6$ composition wherein X is selected from $Li^+$, $Na^+$, $K^+$, and $Rb^+$, Y is selected from $Ca^{2+}$, $Sr^{2+}$, $Ba^{2+}$, $Cd^{2+}$, and $Mg^{2+}$, and Z is selected from $Al^{3+}$, $Ga^{3+}$, and $Sc^{3+}$.

21. The unstable resonator semiconductor laser-pumped, solid-state laser of claim 18 in which optical output power generated by the unstable resonator semiconductor laser is collected and focused by a lens system to form an optical pumping beam whose volume substantially matches the solid-state lasant mode volume.

22. The unstable resonator semiconductor laser-pumped, solid-state laser of claim 18 in which the optical pumping beam substantially matches the solid-state lasant mode volume to produce $TEM_{00}$ optical mode output from the solid-state resonator cavity.

23. The unstable resonator semiconductor laser-pumped, solid-state laser of claim 18 in which the unstable resonator semiconductor laser generates an optical pumping beam, and the optical pumping beam and solid-state lasant mode volume have relatively small radii to facilitate laser operation at a low threshold of optical power output from the unstable resonator semiconductor diode laser.

24. The unstable resonator semiconductor laser-pumped, solid-state laser of claim 18 in which the solid-state lasant is a doped with a rare earth ion selected from a neodymium, holmium, erbium, and thulium.

25. The unstable resonator semiconductor laser-pumped, solid-state laser of claim 18 in which unstable resonator semiconductor laser comprises AlGaAs and in which the solid-state lasant comprises a neodymium-containing lasant crystal.

26. The unstable resonator semiconductor laser-pumped, solid-state laser system of claim 18 in which the unstable resonator semiconductor laser includes:
a resonator having a length, a virtual point source in a lateral plane, and a real point source in a transverse plane; and
a mirror having a radius of curvature that forms one end of the resonator, the resonator length and mirror radius of curvature selected so that an optical field propagating within the high-power semiconductor laser experiences greater than unity lateral magnification and so that the optical field has a lateral divergence angle originating from the virtual point source and a transverse divergence angle originating from the real point source that are substantially equal, thereby to provide the optical output with a high degree of lateral and transverse spatial coherence.

* * * * *